United States Statutory Invention Registration [19]

[11] Reg. Number: H664

Kinman et al. [43] Published: Aug. 1, 1989

[54] POWER COMBINER FOR MICROWAVE SOURCES

[75] Inventors: Darry M. Kinman; Donald R. Bowling, both of Ridgecrest, Calif.

[73] Assignee: The United States of America as represented by the Secretary of the Navy, Washington, D.C.

[21] Appl. No.: 316,346

[22] Filed: Feb. 21, 1989

[51] Int. Cl.[4] ..... H03B 7/14

[52] U.S. Cl. ..... 331/56

[56] References Cited

U.S. PATENT DOCUMENTS 3,931,587 1/1976 Harp et al. ..... 331/56

4,121,174 10/1978 Aston ..... 331/48

OTHER PUBLICATIONS

Chang et al., "W-Band Power Combiner Design", *IEEE Transactions on Microwave Theory and Techniques,* vol. MTT-28, No. 4, Apr. 1980, pp. 295-305.

Chang et al., "140 GHz Silicon IMPATT Power Combiner Development", *Microwave Journal,* vol. 24, No. 6, Jun. 1981, pp. 65-71, 77.

*Primary Examiner*—Thomas H. Tarcza

*Assistant Examiner*—Linda J. Wallace

*Attorney, Agent, or Firm*—William C. Townsend; Melvin J. Sliwka; Stephen J. Church

[57] ABSTRACT

A tuned cavity with a number of coaxial circuit microwave sources spaced about the cavity and disposed oppositely of the cavity from flat loads which suppress oscillations of the sources at undesired frequencies, the loads being adjacent to the cavity to provide wide bandwidth and a compact structure and yet spaced from the cavity a distance substantially less than the wavelengths of the operating frequencies so as to not interfere significantly with the electromagnetic fields in the cavity.

14 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

POWER COMBINER FOR MICROWAVE SOURCES

CROSS REFERENCE TO RELATED APPLICATION

This application is a substitute for application Ser. No. 06/814,864, filed Dec. 30, 1985 and now abandoned.

FIELD OF THE INVENTION

This invention pertains to the field of oscillators. More particularly, it pertains to plural, parallel connected oscillators with a distributed parameter resonator.

DESCRIPTION OF THE PRIOR ART

Power combiners for a plurality of microwave sources spaced about the periphery of a cavity which resonates at a desired operating frequency are well known. Conventionally, in such a combiner the cavity is cylindrical, oscillates in the $TM_{010}$ mode, has a central probe for power output and injection locking input, and each source is a coaxial circuit axially parallel to the cavity with an IMPATT diode and an impedance matching element at one side of the cavity and with a load or termination of lossy material disposed at the other side of the cavity. The load suppresses microwave energy at frequencies other than the operating frequency, particularly at subharmonics thereof, by presenting a low resistive load that is slightly inductive. The load thus suppresses oscillations of the diode at these frequencies. However, at the operating frequency the diode is substantially coupled by the cavity to the output which is configured to provide the proper impedance for oscillation of the diode at this frequency. Typically in such combiners the load is stepped or tapered so as to absorb energy at all frequencies. However, it is known to use a flat load, that is, one presenting a planar surface to the cavity, since a flat load suffices to suppress undesired frequencies while absorbing minimal energy at the operating frequency.

Insofar as known to the applicants, in all prior art microwave power combiners of the above described configuration, as typified in U.S. Pat. No. 3,931,587 to Harp et al., the load is spaced from the cavity a distance which is a substantial fraction of the operating wavelength. Conventionally, this distance is one-half of this wavelength so that at the operating frequency the load sees the same impedance as if it were at the cavity. The applicants believe that the flat or other surface of the load has been so spaced from the cavity heretofore to prevent interference by the lossy material of the load with the electromagnetic fields in the cavity.

Such prior art combiners are, in general, highly effective, but have two disadvantages resulting from the half-wavelength spacing of the load from the cavity. One disadvantage is that the combiner, which is typically constructed from a solid block of metal, is physically bulkier and heavier due to the additional volume of the block required to accommodate this spacing. The resulting weight and bulk are particularly disadvantageous in missiles and satellites where the simplicity and low maintenance of solid state microwave sources are otherwise highly desirable. The other disadvantage is that the half-wavelength spacing is undesirably effective in suppressing oscillations of the source at frequencies close to a predetermined operating frequency even though operation over a relatively wide bandwidth is desired, as in frequency modulation or in multichannel communications. Typically, in such combiners the cavity and source diodes have sufficient bandwidth for such purposes. However, at other frequencies than those very near to the exact frequency corresponding to the half-wavelength spacing, the impedance seen by the source diode is altered sufficiently to prevent its oscillation. As a result, such prior art power combiners are only effective over a bandwidth of a few percent, or less.

SUMMARY OF THE INVENTION

The invention is concerned with a power combiner having a number of coaxial microwave source circuits spaced peripherally about a cavity which resonates at a predetermined operating frequency, each such circuit having a microwave source and a load which are disposed oppositely of the cavity. The invention is characterized by the load being spaced from the cavity a distance which is a small fraction of the operating frequency wavelength so that the load does not interfere with the electromagnetic fields of the cavity and yet does not suppress oscillations of the source over a relatively wide frequency band near the operating frequency.

It is an object of the subject invention to provide, for microwave sources such as IMPATT diodes, a power combiner which is effective and efficient over a relatively wide bandwidth and which is relatively compact and light in weight.

BRIEF DESCRIPTION OF THE DRAWINGS

Other objects, advantages, and novel features of the subject invention will become apparent from the following detailed description when considered with the accompanying drawings in which:

FIG. 3 is a graph showing results obtained with an example of the subject invention.

DESCRIPTION OF THE PREFERRED EMBODIMENT

Figure 1:
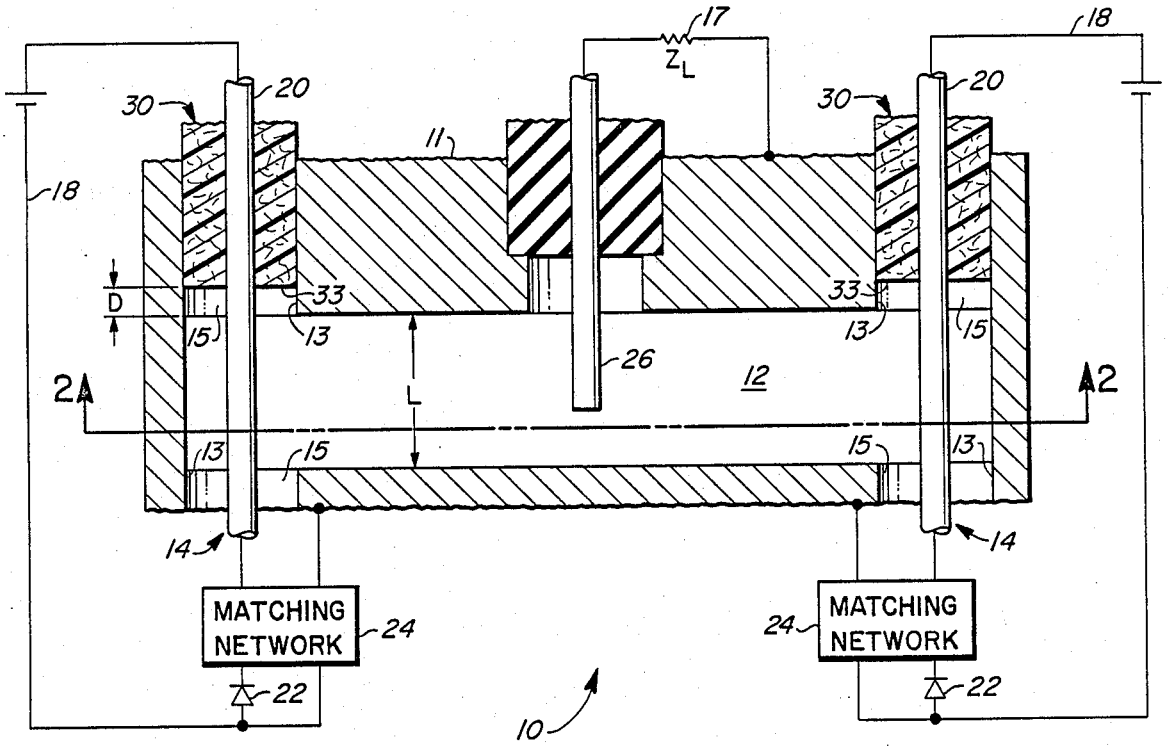
FIG. 1 is a diametrical section of a power combiner, which embodies the subject invention, together with partially schematically represented microwave source circuitry.
Figure 2:
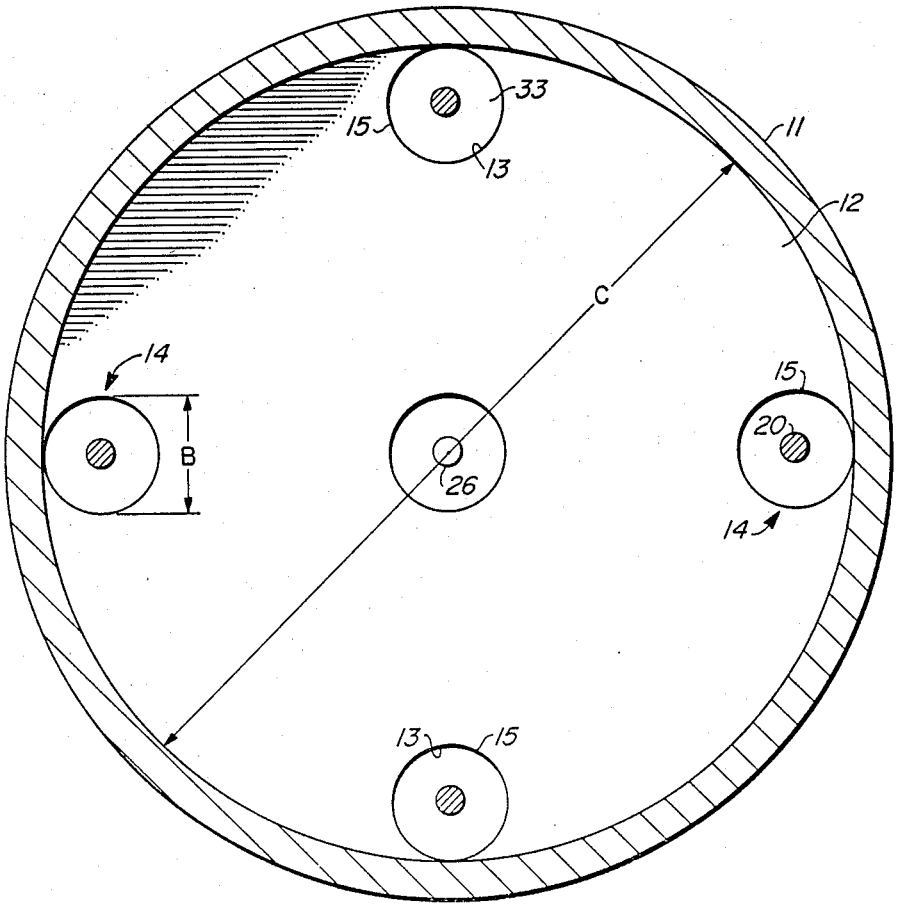
FIG. 2 is a section of the power combiner taken on line 2—2 of FIG. 1.

In FIGS. 1 and 2 is shown a microwave power combiner 10 which embodies the principles of the subject invention. Combiner 10 has a fragmentarily represented body 11 which, functionally, is an exteriorly cylindrical metal block constructed in any suitable manner to define a cylindrical cavity 12 and to define four cylindrical bores or openings 13 corresponding individually to four coaxial microwave source circuits 14 each having a coaxial portion 15 at the corresponding bore 13. Only the portions of body 11, bores 13, and circuits 14 adjacent to cavity 12 are relevant to the subject invention. As a result, only these portions are pictorially represented in FIG. 1, since the balance of the body, the bores, and the circuits may have any suitable arrangement of which a number are well known in the art. Combiner 10 is shown in FIG. 1 with a schematically represented output load 17, which is external to cavity 12 and is indicated by "$Z_L$", and with a pair of schematically represented bias circuits 18, this load and these circuits being subsequently discussed in greater detail.

Cavity 12, whose length is indicated by the letter "L" in FIG. 1 and whose diameter is indicated by the letter "C" in FIG. 2, is configured so that electromagnetic fields in the cavity resonate in the $TM_{010}$ mode in a band of desired microwave frequencies about a predetermined nominal operating frequency. Bores 13, whose diameter is indicated by the letter "B" in FIG. 2, are axially parallel to the cavity and are spaced circumferentially about the cavity at its periphery so as to intersect the cavity thereat. Bores 13 and the corresponding coaxial portions 15 of circuits 14 thus extend oppositely from the cavity in directions axially thereof. It is apparent from FIG. 1 that body 11 is the outer conductor of each coaxial portion 15 of circuits 14 and that the inner diameter of each such outer conductor is predetermined by the diameter "B" of the corresponding bore 13.

Each circuit 14 has a central conductor 20 at its coaxial portion 15, this conductor extending through the corresponding bore 13 and being connected at one side of cavity 12 to a well-known IMPATT diode 22 which is a source of microwave energy. Diode 22 is connected to conductor 20 and body 11 through any suitable matching network 24. Diode 22 and central conductor 20 are also connected in any suitable manner to bias circuit 18. Combiner 10 has any suitable output arrangement, typified by a probe 26 coaxially disposed in cavity 12, for electromagnetically coupling the resonant fields in the cavity to the output load 17 and thereby providing combined microwave energy from diodes 22 to the output load, this energy being coupled by conductors 20 to the cavity. Typically a well-known circulator, not shown, is connected between probe 26 and load 17 for use in controlling, by injection locking, the frequency of microwave energy within the above mentioned band generated by diodes 22.

Each circuit portion 15 has a cylindrical load 30 of any suitable lossy material received coaxially within the circuit portion at the side of cavity 12 opposite the side thereof at which diode 22 is connected. Each load 30 has an axial end surface 33 extending transversely of the corresponding bore 13 and disposed toward cavity 12 so that the coaxial portion 15 corresponding to each load extends between such surface and the cavity. Surface 33 is spaced a predetermined distance, indicated by the letter "D" in FIG. 1, from the cavity and this distance is substantially less than diameter "B" of bores 13 and is substantially less than one-fourth of wavelengths along coaxial circuit portion 15 between the surface and the cavity in the above mentioned desired band of operating frequencies. Surface 33, preferably, is planar and normal to the axis of the corresponding opening so that load 30 is a "flat load".

OPERATION

The operation of the described embodiment of the subject invention will now be discussed beginning with the operation of power combiners which have the general configuration of combiner 10 and which combine microwave power from IMPATT diode oscillators. Such a diode will oscillate at any frequency over a wide frequency range, which includes undesired frequencies as well as frequencies in a desired band, so long as the diode is presented with a predetermined impedance at the frequency. Therefore, to obtain power at desired frequencies in a combiner such as combiner 10, it is necessary to configure external load 17, probe 26, cavity 12, and each source circuit 14 to present the diode 22 of the source circuit with the proper impedance at the desired frequencies. It is also necessary to couple sufficient energy at these frequencies from the diode to output load 17, instead of to lossy load 30, that the latter load is ineffective to suppress oscillations of the diode. To suppress undesired frequencies, external load 17, probe 26, cavity 12, and each circuit 14 including the lossy load 30 thereof are configured so that, at the undesired frequencies, the diode 22 of the circuit is coupled sufficiently to the lossy load to present the diode with an improper impedance for oscillation. If lossy load 30 is spaced from cavity 12 a distance, such as one-half of the wavelength of one desired frequency, which results in the lossy load being decoupled from the cavity, it is apparent that any change in frequency, even to another desired frequency near the one frequency, will tend to couple the lossy load to the diode and narrow the bandwidth of desired frequencies about the one frequency. It is also apparent that a stepped or tapered region of a load otherwise similar to load 30, while effective in suppressing undesired frequencies, will also tend to suppress desired frequencies.

However, in the subject invention predetermined distance "D" is selected so that, while this distance is large enough that lossy load 30 does not substantially interfere with the electromagnetic fields in cavity 12 which couple circuits 14 to probe 26 and to external load 17 and thus provide proper impedance to diodes 22 for oscillation at desired frequencies, distance "D" is sufficiently small that the band of desired frequencies is not narrowed by this distance being large enough to tune sufficient energy in a portion of the desired frequencies to couple to lossy load 30 and present diode 22 with an improper impedance for oscillation at this portion of the desired frequencies. In other words, distance "D" is sufficiently small that, across the band of desired frequencies, insufficient energy is coupled to lossy load 30 to present diode 20 with an impedance which is improper for oscillation of the diode.

EXAMPLE

A power combiner was constructed conforming to FIGS. 1 and 2 and to combiner 10 of the above "Description of the Preferred Embodiment". The combiner was tested with a matched impedance, variable frequency microwave source which was connected successively to the four circuits 14 in lieu of the diodes 22 and matching networks 24, and the output power at a matched load corresponding to load 17 was measured. The data from these tests was combined in accordance with U.S. Pat. No. 4,497,030 for a "N-Way Summing Network Characterization System" to obtain the results shown in FIG. 3 wherein it is seen that the combiner of the subject invention provided a peak efficiency of 74 percent near the nominal operating frequency of 10 GHz with a 3 db bandwidth of 10 percent.

In the combiner used to obtain the results of FIG. 3, the diameter "C" of cavity 12 was 0.85 inch (21.6 mm) the length "L" of the cavity was 0.15 inch (3.8 mm), the diameter "B" of the bores 13 was 0.116 inch (2.9 mm), and the predetermined distance "D" that the planar surfaces 33 of the loads 30 were spaced from the cavity was 0.025 inch (0.635 mm). In the tested combiner, the diameter of bores 13 was thus less than one-fourth of the diameter of cavity 12 and the distance that surfaces 33 were spaced from cavity 12 was less than the diameter of bores 13 and less than one-fourth of the wavelengths in circuit portions 15 between surfaces 33 and cavity 12 in the frequency band shown in FIG. 3 in which the nominal central frequency of 10 GHz has a free space one-quarter wavelength of about 0.29 inch (0.75 cm). In the tested combiner, the ratio of bore diameter "B" to distance "D" was 0.116 inch/0.025 inch or 4.64, so that this distance was about one-fifth of the diameter of bores 13.

Obviously many modifications and variations of the present invention, such as varying the number of bores 13 and associated circuits 14 and using other arrangements of microwave sources such as IMPATT diodes 22, are possible in view of the above teachings. It is therefore to be understood that the invention may be practiced within the scope of the following claims other than as specifically described.

What is claimed is:

1. In a microwave power combiner having a cavity resonant in a frequency band about a predetermined frequency and having a microwave source circuit which extends oppositely from the cavity and has a microwave source disposed at one side of the cavity and a load constructed of lossy material which is disposed at the other side of the cavity to suppress oscillations of said source outside of said band and which bears a surface disposed toward the cavity and spaced a predetermined distance therefrom, the improvement comprising said predetermined distance being less than one-fourth of the wavelength in said circuit along said distance at said frequency.

2. The power combiner of claim 1 wherein said predetermined distance is such that said load does not substantially interfere with electromagnetic fields in said cavity.

3. The power combiner of claim 1 wherein said source is an IMPATT diode.

4. The power combiner of claim 1 wherein said source circuit has a coaxial portion extending between said surface of said load and the cavity, and said coaxial portion has a predetermined inner diameter, and wherein said predetermined distance is less than said inner diameter.

5. The power combiner of claim 4 wherein said predetermined distance is about one-fifth of said inner diameter.

6. The power combiner of claim 4 wherein said cavity is cylindrical, is axially parallel to said coaxial portion, and is configured to resonate in the $TM_{010}$ mode at said frequency band, and wherein said coaxial portion is disposed peripherally of the cavity.

7. In a microwave power combiner having a body defining a cavity configured to resonate in a band of desired frequencies and defining an outer conductor portion of a coaxial microwave source circuit in which said portion is axially parallel to the cavity, disposed peripherally thereof, and extended oppositely axially therefrom, said circuit having a microwave source which is disposed at one side of the cavity and which is capable of oscillating at said desired frequencies and at undesired frequencies outside of said band and said circuit having a lossy element disposed at the other side of said cavity within said outer conductor portion and said lossy element being effective to suppress oscillations of said source at said undesired frequencies and bearing a surface extended transversely of said outer conductor portion and disposed toward the cavity, the improvement comprising said surface of said lossy element being spaced from the cavity a predetermined distance which is less than one-fourth of a wavelength along said conductor portion in said frequency band.

8. The power combiner of claim 7 wherein said microwave source requires, at any frequency, connection to a predetermined impedance in order to oscillate at the frequency; the combiner has output means for electromagnetically coupling to the cavity a load externally thereof; said load, said output means, said cavity, and said source circuit are configured to present said source with the proper impedance for oscillation at said desired frequencies and to couple sufficient energy at said desired frequencies from said source to said load so that said lossy element is ineffective to suppress oscillations of said source at said desired frequencies; and said load, said output means, said cavity, said source circuit, and said lossy element are configured so that, at said undesired frequencies, said source is coupled sufficiently to said lossy element to present said source with improper impedances for oscillation at said undesired frequencies; wherein said predetermined distance is sufficiently large that electromagnetic fields in the cavity providing such proper impedance and such coupling at said desired frequencies are not substantially affected; and wherein said predetermined distance is sufficiently small that, in said band of desired frequencies, insufficient energy is coupled to said lossy element to present said source with an impedance improper for oscillation.

9. The power combiner of claim 8 wherein said surface of said lossy element is planar and said predetermined distance is about one-fifth of the diameter of said outer conductor portion.

10. The power combiner of claim 7 wherein the cavity is configured to resonate in the $TM_{010}$ mode, wherein the inner diameter of said outer conductor portion is less than one-fourth of the diameter of the cavity and wherein said predetermined distance is less than the inner diameter of said outer conductor portion.

11. The power combiner of claim 10 wherein said surface of said lossy element is planar and said predetermined distance is about one-fifth of the inner diameter of said outer conductor portion.

12. A microwave power combiner comprising:

a body defining a cylindrical cavity, and a plurality of cylindrical openings parallel to the axis of the cavity and spaced circumferentially thereabout, said openings intersecting the cavity peripherally, extending axially oppositely therefrom, and corresponding individually to a plurality of coaxial circuits having the body as the outer conductor of each of said circuits along the corresponding opening:

a plurality of IMPATT diodes corresponding individually to said circuits, the diode corresponding to each circuit being connected thereto from a predetermined side of the cavity: and a plurality of cylindrical loads constructed of lossy material and corresponding individually to said circuits, each of said loads being coaxially received in the opening of the corresponding circuit oppositely of the cavity from said predetermined side thereof and each of said loads bearing an axial end surface disposed toward the cavity and spaced therefrom axially a distance less than the diameter of the opening which receives the load.

13. The power combiner of claim 12 wherein the combiner has a predetermined operating frequency and said distance is less than one-fourth of the wavelength along the opening between said surface and the cavity at said frequency.

14. The power combiner of claim 12 wherein said surface is planar and normal to the axis of the corresponding opening and wherein said distance is about one-fifth of the diameter of such corresponding opening at said surface.

* * * * *